(12) United States Patent
Chayat et al.

(10) Patent No.: US 9,201,237 B2
(45) Date of Patent: Dec. 1, 2015

(54) DIFFRACTION-BASED SENSING OF MIRROR POSITION

(71) Applicant: PRIMESENSE LTD., Tel Aviv (IL)

(72) Inventors: Naftali Chayat, Kfar Saba (IL); Raviv Ehrlich, Rehovot (IL); Alexander Shpunt, Tel Aviv (IL)

(73) Assignee: APPLE INC., Cupertino, CA (US)

( * ) Notice: Subject to any disclaimer, the term of this patent is extended or adjusted under 35 U.S.C. 154(b) by 365 days.

(21) Appl. No.: 13/798,231

(22) Filed: Mar. 13, 2013

(65) Prior Publication Data

US 2013/0250387 A1 Sep. 26, 2013

Related U.S. Application Data

(60) Provisional application No. 61/614,029, filed on Mar. 22, 2012.

(51) Int. Cl.
*G02B 26/08* (2006.01)
*G02B 26/10* (2006.01)
*G02B 5/18* (2006.01)
*G01S 7/481* (2006.01)
*G01S 7/497* (2006.01)
(Continued)

(52) U.S. Cl.
CPC ............... *G02B 26/10* (2013.01); *G01S 7/4817* (2013.01); *G01S 7/497* (2013.01); *G02B 5/1814* (2013.01); *G02B 26/101* (2013.01); *G01S 17/89* (2013.01); *G02B 26/106* (2013.01); *G03F 7/0005* (2013.01)

(58) Field of Classification Search
CPC .. G02B 26/101; G02B 26/105; G02B 26/106; G02B 26/10; G02B 5/1814; G03F 7/0005; G01S 17/89; G01S 7/4817; G01S 7/497
USPC ........... 359/207.7, 212.1–214.1, 223.1–226.1
See application file for complete search history.

(56) References Cited

U.S. PATENT DOCUMENTS 3,796,498 A 3/1974 Post
4,850,673 A 7/1989 Velzel et al.
(Continued)

FOREIGN PATENT DOCUMENTS

CN 1725042 A 1/2006
DE 102009046911 A1 * 5/2011
(Continued)

OTHER PUBLICATIONS

U.S. Appl. No. 13/567,095 Office Action dated Oct. 1, 2013.
(Continued)

*Primary Examiner* — James Phan
(74) *Attorney, Agent, or Firm* — D. Kligler I.P. Services Ltd.

(57) ABSTRACT

Scanning apparatus includes a transmitter, which is configured to emit a beam comprising pulses of light, and a scanning mirror, which is configured to scan the beam over a scene. A receiver is configured to receive the light reflected from the scene and to generate an output indicative of the pulses returned from the scene. A grating is formed on an optical surface in the apparatus and is configured to diffract a portion of the beam at a predetermined angle, so as to cause the diffracted portion to be returned from the scanning mirror to the receiver. A controller is coupled to process the output of the receiver so as to detect the diffracted portion and to monitor a scan of the mirror responsively thereto.

10 Claims, 2 Drawing Sheets

(51) Int. Cl.
*G03F 7/00* (2006.01)
*G01S 17/89* (2006.01)

(56) References Cited

U.S. PATENT DOCUMENTS

| | | | |
|---|---|---|---|
| 5,406,543 | A | 4/1995 | Kobayashi et al. |
| 5,477,383 | A | 12/1995 | Jain |
| 5,606,181 | A | 2/1997 | Sakuma et al. |
| 5,648,951 | A | 7/1997 | Kato et al. |
| 5,691,989 | A | 11/1997 | Rakuljic et al. |
| 5,742,262 | A | 4/1998 | Tabata et al. |
| 5,781,332 | A | 7/1998 | Ogata |
| 6,002,520 | A | 12/1999 | Hoch et al. |
| 6,031,611 | A | 2/2000 | Rosakis et al. |
| 6,229,598 | B1 | 5/2001 | Yoshida |
| 6,288,775 | B1 | 9/2001 | Tanaka |
| 6,560,019 | B2 | 5/2003 | Nakai |
| 6,583,873 | B1 | 6/2003 | Goncharov et al. |
| 6,611,000 | B2 | 8/2003 | Tamura et al. |
| 6,707,027 | B2 | 3/2004 | Liess et al. |
| 6,927,852 | B2 | 8/2005 | Reel |
| 6,940,583 | B2 | 9/2005 | Butt et al. |
| 7,112,774 | B2 | 9/2006 | Baer |
| 7,227,618 | B1 | 6/2007 | Bi |
| 7,304,735 | B2 | 12/2007 | Wang et al. |
| 7,335,898 | B2 | 2/2008 | Donders et al. |
| 7,700,904 | B2 | 4/2010 | Toyoda et al. |
| 7,952,781 | B2 | 5/2011 | Weiss et al. |
| 8,384,997 | B2 | 2/2013 | Shpunt et al. |
| 2004/0012958 | A1 | 1/2004 | Hashimoto et al. |
| 2004/0082112 | A1 | 4/2004 | Stephens |
| 2005/0178950 | A1 | 8/2005 | Yoshida |
| 2006/0001055 | A1 | 1/2006 | Ueno et al. |
| 2006/0072100 | A1 | 4/2006 | Yabe |
| 2006/0215149 | A1 | 9/2006 | LaBelle et al. |
| 2006/0252167 | A1 | 11/2006 | Wang |
| 2006/0252169 | A1 | 11/2006 | Ashida |
| 2006/0269896 | A1 | 11/2006 | Liu et al. |
| 2007/0019909 | A1 | 1/2007 | Yamauchi et al. |
| 2008/0198355 | A1 | 8/2008 | Domenicali et al. |
| 2008/0212835 | A1 | 9/2008 | Tavor |
| 2008/0240502 | A1 | 10/2008 | Freedman et al. |
| 2008/0278572 | A1 | 11/2008 | Gharib et al. |
| 2009/0090937 | A1 | 4/2009 | Park |
| 2009/0096783 | A1 | 4/2009 | Shpunt et al. |
| 2009/0183125 | A1 | 7/2009 | Magal et al. |
| 2009/0185274 | A1 | 7/2009 | Shpunt |
| 2010/0007717 | A1 | 1/2010 | Spektor et al. |
| 2010/0013860 | A1 | 1/2010 | Mandella et al. |
| 2010/0142014 | A1 | 6/2010 | Rosen et al. |
| 2011/0019258 | A1 | 1/2011 | Levola |
| 2011/0069389 | A1 | 3/2011 | Shpunt |
| 2011/0075259 | A1 | 3/2011 | Shpunt |
| 2011/0114857 | A1 | 5/2011 | Akerman et al. |
| 2011/0141480 | A1* | 6/2011 | Meissner ............... 356/498 |
| 2011/0187878 | A1 | 8/2011 | Mor et al. |
| 2011/0188054 | A1 | 8/2011 | Petronius et al. |
| 2011/0228251 | A1 | 9/2011 | Yee et al. |
| 2011/0295331 | A1 | 12/2011 | Wells et al. |
| 2012/0038986 | A1 | 2/2012 | Pesach |
| 2012/0140094 | A1 | 6/2012 | Shpunt et al. |
| 2012/0140109 | A1 | 6/2012 | Shpunt et al. |
| 2013/0038881 | A1 | 2/2013 | Pesach et al. |
| 2013/0038941 | A1 | 2/2013 | Pesach et al. |

FOREIGN PATENT DOCUMENTS

| | | |
|---|---|---|
| JP | 2011118178 A | 6/2011 |
| WO | 2007/043036 A1 | 4/2007 |
| WO | 2007/105205 A2 | 9/2007 |
| WO | 2008/120217 A2 | 10/2008 |
| WO | 2010/004542 A1 | 1/2010 |
| WO | 2012020380 A1 | 2/2012 |
| WO | 2012066501 A1 | 5/2012 |

OTHER PUBLICATIONS

U.S. Appl. No. 13/008,042 Office Action dated Dec. 3, 2013.
International Application # PCT/IB2014/062244 Search Report dated Oct. 30, 2014.
Awtar et al, "Two-axis Optical MEMS Scanner," Proceedings of the ASPE Annual Meeting, Paper No. 1800, 4 pages, 2005.
Fienup, J.R., "Phase Retrieval Algorithms: A Comparison", Applied Optics, vol. 21, No. 15, Aug. 1, 1982.
International Application PCT/IL2008/01592 Search Report dated Apr. 3, 2009.
U.S. Appl. No. 12/840,312 Office Action dated Jul. 12, 2012.
Gerchberg et al., "A Practical Algorithm for the Determination of the Phase from Image and Diffraction Plane Pictures," Journal Optik, vol. 35, No. 2, pp. 237-246, year 1972.
Sazbon et al., "Qualitative Real-Time Range Extraction for Preplanned Scene Partitioning Using Laser Beam Coding," Pattern Recognition Letters 26, pp. 1772-1781, year 2005.
Moharam et al. "Rigorous coupled-wave analysis of planar-grating diffraction", Journal of the Optical Society of America, vol. 71, No. 6, pp. 818-818, Jul. 1981.
U.S. Appl. No. 12/945,908 Official Action dated Dec. 5, 2012.
Eisen et al., "Total internal reflection diffraction grating in conical mounting", Optical Communications 261, pp. 13-18, year 2006.
O'Shea et al., "Diffractive Optics: Design, Fabrication and Test", SPIE Tutorial Texts in Optical Engineering, vol. TT62, pp. 66-72, SPIE Press, USA 2004.
U.S. Appl. No. 13/008,042 Official Action dated Jan. 3, 2013.
U.S. Appl. No. 61/568,185, filed Dec. 8, 2011.
U.S. Appl. No. 12/330,766 Official Action dated Dec. 14, 2010.
Ezconn Czech A.S. "Site Presentation", Oct. 2009.
Luxtera Inc., "Luxtera Announces World's First 10GBit CMOS Photonics Platform", Carlsbad, USA, Mar. 28, 2005 (press release).
Bradley et al., "Synchronization and Rolling Shutter Compensation for Consumer Video Camera Arrays", IEEE International Workshop on Projector-Camera Systems—PROCAMS 2009, Miami Beach, Florida, 2009.
Marcia et al., "Fast Disambiguation of Superimposed Images for Increased Field of View", IEEE International Conference on Image Processing, San Diego, USA, Oct. 12-15, 2008.
U.S. Appl. No. 12/955,940 Office Action dated Jun. 27, 2012.
Btendo, "Two Uni-axial Scanning Mirrors Vs One Bi-axial Scanning Mirror", Kfar Saba, Israel, Aug. 13, 2008.
Microvision Inc., "Micro-Electro-Mechanical System (MEMS) Scanning Mirror", years 1996-2009.
European Patent Application # 11150668.9 Partial European Search Report dated Apr. 1, 2011.
U.S. Appl. No. 12/330,766 Official Action dated Jun. 7, 2011.
Garcia et al., "Three-dimensional mapping and range measurement by means of projected speckle patterns", Applied Optics, vol. 47, No. 16, pp. 3032-3040, Jun. 1, 2008.
Garcia et al.., "Projection of Speckle Patterns for 3D Sensing", Journal of Physics, Conference series 139, year 2008.
CN Patent Application # 200880119911.9 Office Action dated Jan. 29, 2012.
U.S. Appl. No. 12/955,939 Office Action dated Jan. 30, 2012.
U.S. Appl. No. 12/955,940 Office Action dated Jan. 11, 2012.
U.S. Appl. No. 12/762,373 Office Action dated Mar. 7, 2012.
International Application PCT/IB2011/053560 Search Report dated Jan. 19, 2012.
U.S. Appl. No. 61/611,075, filed Mar. 15, 2012.
International Application PCT/IB2011/055155 Search Report dated Apr. 20, 2012.
U.S. Appl. No. 12/955,939 Office Action dated Jun. 1, 2012.
Shpunt et al., U.S. Appl. No. 61/764,554, filed Feb. 14, 2013.
U.S. Appl. No. 12/330,766 Office Action dated Jul. 16, 2013.
International Application PCT/IB2013/051986 Search Report dated Jul. 30, 2013.
U.S. Appl. No. 13/008,042 Office Action dated Jul. 15, 2013.
U.S. Appl. No. 14/302,447 Office Action dated Sep. 24, 2015.

* cited by examiner

DIFFRACTION-BASED SENSING OF MIRROR POSITION

CROSS-REFERENCE TO RELATED APPLICATION

This patent application claims the benefit of U.S. Provisional Patent Application 61/614,029, filed Mar. 22, 2012, which is incorporated herein by reference.

FIELD OF THE INVENTION

The present invention relates generally to optical scanning.

BACKGROUND

Optical scanners are used in a wide range of applications. Some scanners use a rotating mirror to scan a beam.

PCT International Publication WO 2012/020380, whose disclosure is incorporated herein by reference, describes apparatus for mapping, which includes an illumination module. This module includes a radiation source, which is configured to emit a beam of radiation, and a scanner, which is configured to receive and scan the beam over a selected angular range. Illumination optics are configured to project the scanned beam so as to create a pattern of spots extending over a region of interest. An imaging module is configured to capture an image of the pattern that is projected onto an object in the region of interest. A processor is configured to process the image in order to construct a three-dimensional (3D) map of the object.

In one of the embodiments described in this PCT publication, an illumination module comprises one or more beam sensors, such as photodiodes, which are coupled to a processor. These sensors are positioned at a selected angle or angles within the angular range that is scanned by a mirror so as to receive the scanned beam periodically and thus verify that the scanner is operating.

U.S. Patent Application Publication 2011/0279648, whose disclosure is incorporated herein by reference, describes a method for constructing a 3D representation of a subject, which comprises capturing, with a camera, a 2D image of the subject. The method further comprises scanning a modulated illumination beam over the subject to illuminate, one at a time, a plurality of target regions of the subject, and measuring a modulation aspect of light from the illumination beam reflected from each of the target regions. A moving-mirror beam scanner is used to scan the illumination beam, and a photodetector is used to measure the modulation aspect. The method further comprises computing a depth aspect based on the modulation aspect measured for each of the target regions, and associating the depth aspect with a corresponding pixel of the 2D image.

U.S. Pat. No. 8,018,579, whose disclosure is incorporated herein by reference, describes a three-dimensional imaging and display system in which user input is optically detected in an imaging volume by measuring the path length of an amplitude modulated scanning beam as a function of the phase shift thereof. Visual image user feedback concerning the detected user input is presented.

U.S. Pat. No. 7,952,781, whose disclosure is incorporated herein by reference, describes a method of scanning a light beam and a method of manufacturing a microelectromechanical system (MEMS), which can be incorporated in a scanning device.

SUMMARY

Embodiments of the present invention that are described hereinbelow provide improved scanning devices, as well as apparatus and methods for 3D mapping using such devices.

There is therefore provided, in accordance with an embodiment of the present invention, scanning apparatus, which includes a transmitter, which is configured to emit a beam including pulses of light, and a scanning mirror, which is configured to scan the beam over a scene. A receiver is configured to receive the light reflected from the scene and to generate an output indicative of the pulses returned from the scene. A grating is formed on an optical surface in the apparatus and is configured to diffract a portion of the beam at a predetermined angle, so as to cause the diffracted portion to be returned from the scanning mirror to the receiver. A controller is coupled to process the output of the receiver so as to detect the diffracted portion and to monitor a scan of the mirror responsively thereto.

In a disclosed embodiment, the grating is formed by photolithography on the mirror. The scanning mirror may be produced by applying a photolithographic process to a substrate and then etching the substrate to define the mirror and spindles connecting the mirror to a support, thereby defining an axis of rotation of the mirror relative to the support The receiver may be positioned to receive the pulses reflected from the scene after reflection of the reflected pulses from the scanning mirror.

In some embodiments, the controller is configured to calibrate the scan of the mirror responsively to detection of the diffracted portion. In one embodiment, the grating generates multiple diffraction lobes at different respective angles, and the controller is configured to calibrate an angular scale and speed of the scan by monitoring a spacing between the lobes, responsively to the detection of the diffracted portion.

Additionally or alternatively, the controller is configured, upon failing to detect the diffracted portion at an expected time, to determine that the apparatus has malfunctioned. The controller may be configured to turn off the beam from the transmitter upon determining that the apparatus has malfunctioned.

In a disclosed embodiment, the controller is configured to process the output of the receiver during the scan so as to generate a three-dimensional map of the scene.

There is also provided, in accordance with an embodiment of the present invention, a method for scanning, which includes emitting a beam including pulses of light from a transmitter and scanning the emitted beam over a scene. The light reflected from the scene is received at a receiver, which generates an output indicative of the pulses returned from the scene. A grating is provided on an optical surface that intercepts the emitted beam so as to diffract a portion of the beam at a predetermined angle, such that the diffracted portion is returned to the receiver without reflecting from the scene. The output of the receiver is processed so as to detect the diffracted portion, and a scan of the beam is monitored responsively thereto.

The present invention will be more fully understood from the following detailed description of the embodiments thereof, taken together with the drawings in which:

DETAILED DESCRIPTION OF EMBODIMENTS

U.S. patent application Ser. No. 13/766,801, filed Feb. 14, 2013, which is assigned to the assignee of the present patent application and whose disclosure is incorporated herein by reference, describes depth engines that generate 3D mapping data by measuring the time of flight of a scanning beam. A light transmitter, such as a laser, directs short pulses of light toward a scanning mirror, which scans the light beam over a scene of interest. A receiver, such as a sensitive, high-speed photodiode (for example, an avalanche photodiode) receives light returned from the scene via the same scanning mirror. Processing circuitry measures the time delay between the transmitted and received light pulses at each point in the scan. This delay is indicative of the distance traveled by the light beam, and hence of the depth of the object at the point. The processing circuitry uses the depth data thus extracted in producing a 3D map of the scene.

Embodiments of the present invention that are described herein provide methods for beam monitoring that can be used advantageously with the scanners described above, as well as with other types of mirror-based scanners. These methods intentionally create "stray" reflections from the scanning mirror, by forming a low-efficiency grating on an optical surface, such as the mirror surface, for example, or on a cover glass or any other suitable optical surface in the path of the outgoing light beam. These stray reflections are reflected from the mirror at predetermined, known angles. (There is stray light generally present in such a system at any angle, but the grating imposes a well-defined structure on the stray light and increases its level in certain well-defined directions.)

A photodetector in the scanning head—which may be the same detector that is used to receive light returned from the scene in the sort of scanning head that is described above—will thus receive the stray reflections from the scanning mirror periodically, whenever the mirror passes through a particular, predetermined angle in its scan. Detection of the light pulses due to the stray reflection indicates that the mirror is scanning properly. These light pulses may also be used to calibrate scan angles during operation.

The approach adopted by embodiments of the present invention is advantageous, inter alia, in that it can make use of existing components—including the mirror itself and the photodetector—in order to perform beam monitoring functions, and requires essentially no additional hardware. This approach enhances the safety and accuracy of the scanning head. Although one embodiment is described in detail hereinbelow with reference to the design of a particular sort of scanning head in the specific context of 3D mapping, the principles of the present invention may similarly be applied to other types of mirror-based scanners, for both 3D mapping and other applications.

Figure 1:
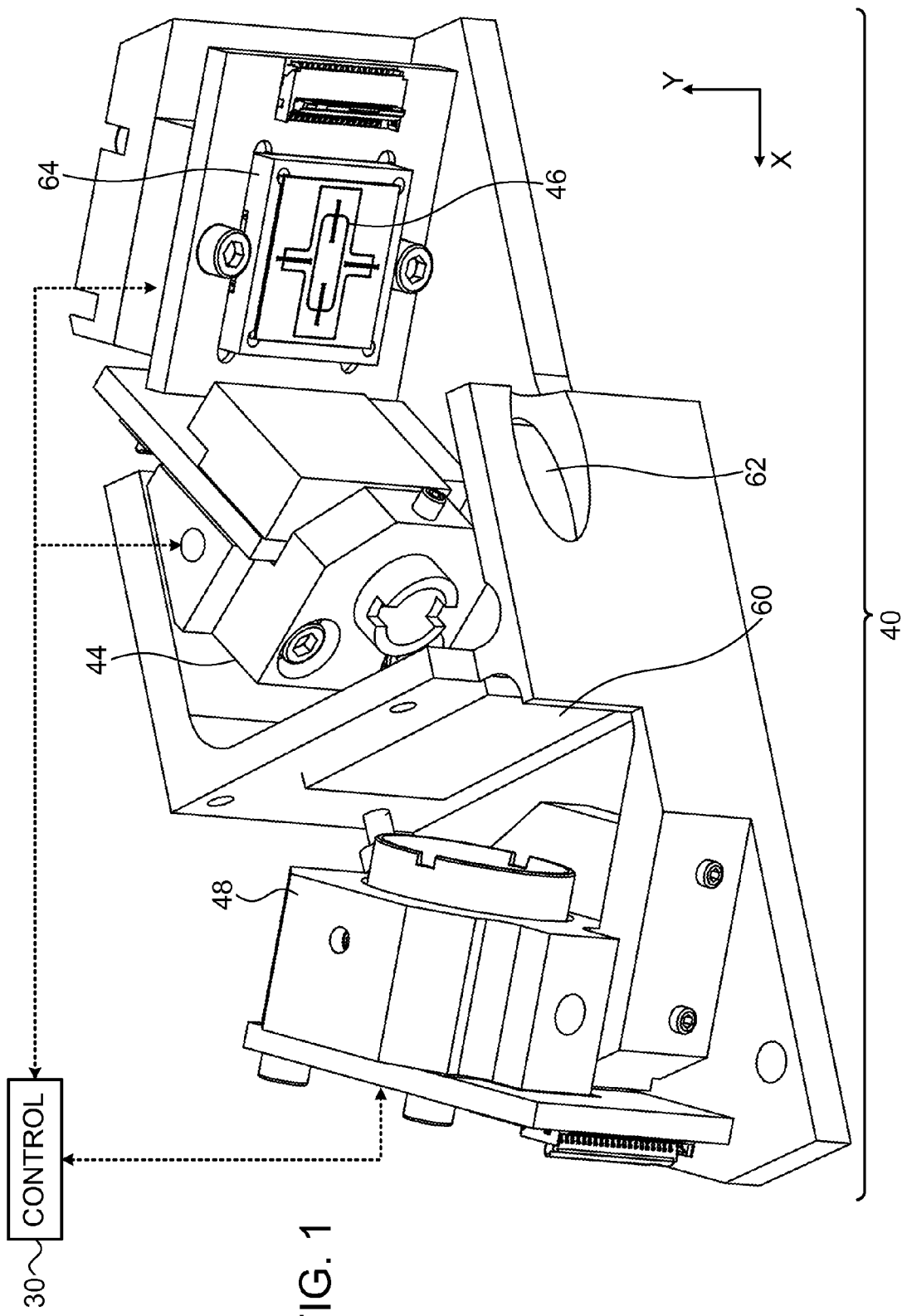
FIG. 1 is a schematic, pictorial illustration of an optical scanning head, in accordance with an embodiment of the present invention.

FIG. 1 is a schematic, pictorial illustration of an optical scanning head 40 comprising a grating-based beam monitor, in accordance with an embodiment of the present invention. With the exception of the beam monitor itself, optical scanning head 40 is similar to the optical scanning head that is described in the above-mentioned U.S. patent application Ser. No. 13/766,801.

Figure 2:
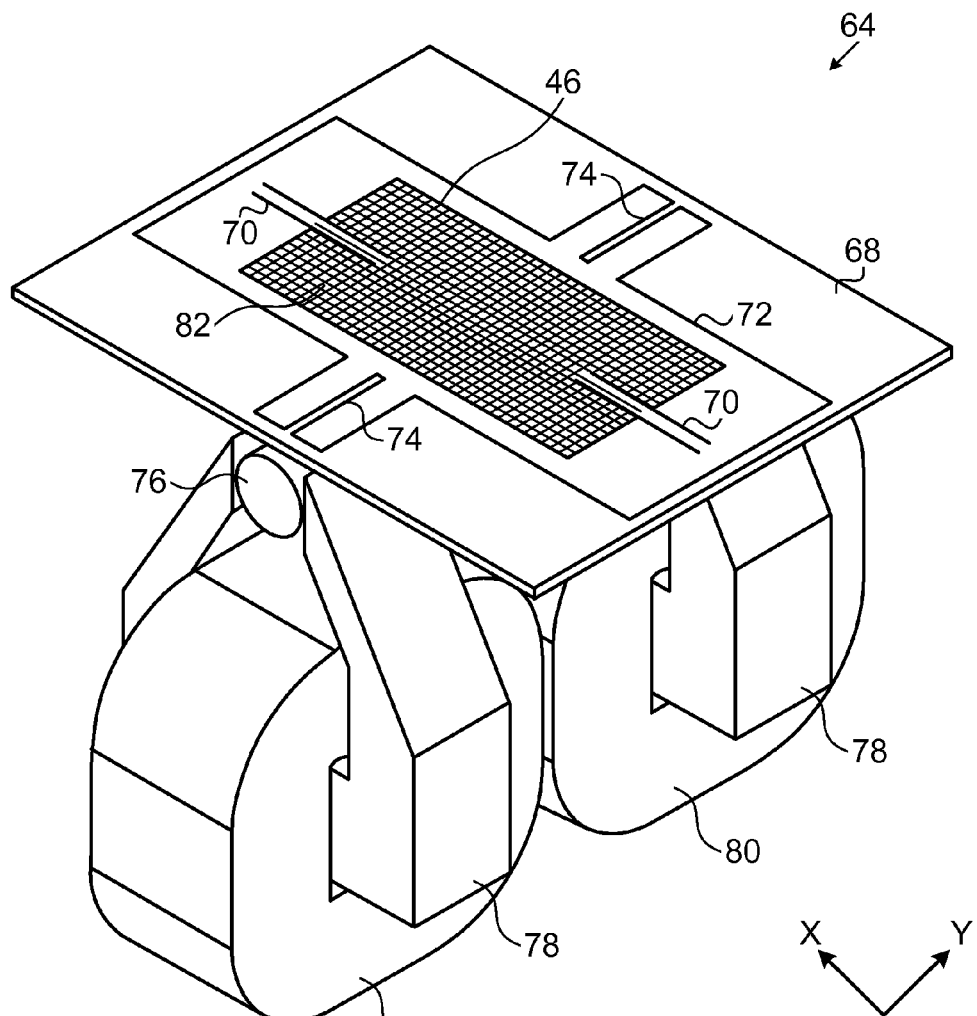
FIG. 2 is a schematic, pictorial illustration of a MEMS scanner, in accordance with an embodiment of the present invention.

A transmitter 44 emits pulses of light toward a polarizing beamsplitter 60. Typically, only a small area of the beamsplitter, directly in the light path of transmitter 44, is coated for reflection, while the remainder of the beamsplitter is fully transparent (or even anti-reflection coated) to permit returned light to pass through to a receiver 48. The light from transmitter 44 reflects off beamsplitter 60 and then a folding mirror 62 toward a scanning micromirror 46, which is ruled with a grating for the purpose of beam monitoring, as described below. A MEMS scanner 64 scans the micromirror in X- and Y-directions with the desired scan frequency and amplitude. Details of the micromirror and scanner are shown in FIG. 2.

Figure 3:
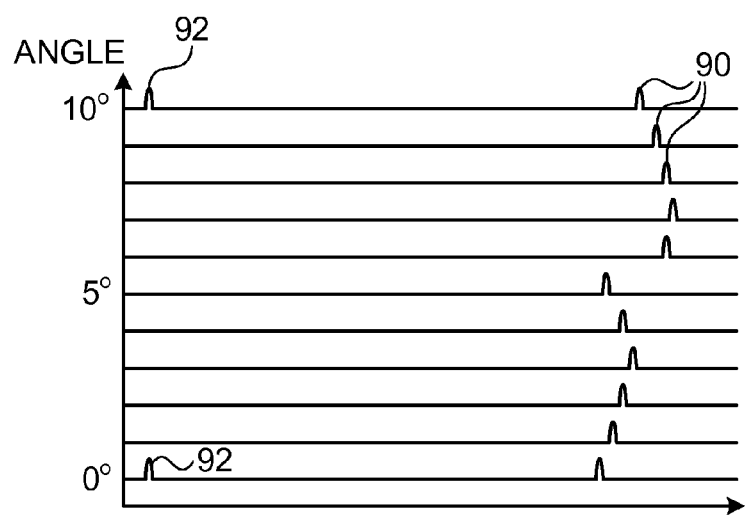
FIG. 3 is a schematic plot of signals output by a receiver in an optical scanning head, in accordance with an embodiment of the invention.

Light pulses returned from the scene strike micromirror 46, which reflects the light via folding mirror 62 through beamsplitter 60. A receiver 48 senses the returned light pulses and generates corresponding electrical pulses. To limit the amount of unwanted ambient light that reaches receiver 48, a bandpass filter (not shown) may be incorporated in the receiver path, possibly on the same substrate as beamsplitter 60. The receiver typically comprises a sensitive, high-speed photodetector, such as an avalanche photodiode (APD). A sensitive amplifier, such as a transimpedance amplifier (TIA), amplifies the electrical pulses output by the photodetector, as illustrated in FIG. 3, which are indicative of the times of flight of the corresponding pulses of light.

A controller 30 drives transmitter 44 and scanner 64 and analyzes the time delay between the transmitted pulses and the corresponding pulses from receiver 48 in order to measure the time of flight of each pulse. Based on this time of flight, the controller computes the depth coordinate (Z) of each point (X,Y) in the scene that is scanned by scanning head 40 and thus generates a depth map of the scene. Controller 30 also uses the pulses that are output by receiver 48 in monitoring of the scan, as described hereinbelow.

The specific mechanical and optical designs of the optical head shown in FIG. 1 are described here by way of example, and alternative designs implementing similar principles are considered to be within the scope of the present invention.

FIG. 2 is a schematic, pictorial illustration of mirror 46 and MEMS scanner 64, in accordance with an embodiment of the present invention. This scanner is produced and operates on principles similar to those described in the above-mentioned U.S. Pat. No. 7,952,781, but enables two-dimensional scanning of a single micromirror. Alternatively, the principles of the present invention may be applied to other sorts of scanning mirrors, such as the one described by Awtar, et al., "Two-axis Optical MEMS Scanner," Proceedings of the ASPE 2005 Annual Meeting (Norfolk, Va., Paper No. 1800, 2005). Further alternatively, the methods of beam monitoring that are described hereinbelow may be used with mirrors that scan only in a single direction.

Micromirror 46 is produced by applying a suitable photolithographic process to and then etching a semiconductor substrate 68 to separate the micromirror from a support 72, and to separate the support from the remaining substrate 68. After etching, micromirror 46 (to which a suitable reflective coating is applied) is able to rotate in the Y-direction relative to support 72 on spindles 70, while support 72 rotates in the X-direction relative to substrate 68 on spindles 74.

Micromirror 46 itself is etched with a fine, shallow grating 82, designed to diffract a small portion (typically less than 1%) of the incident beam at certain specific angles, which are determined by the grating pitch. Alternatively, the grating can be printed, patterned in the reflective metal coating layer, embossed in a polymer coating, or mounted on the mirror surface or elsewhere in the path of light outgoing from the mirror to the scene. Although for the sake of visual clarity, the lines of grating 82 in FIG. 2 are widely spaced and clearly visible, in practice the grating lines may be closer together and invisible to the naked eye. Although grating 82 is ruled in both the X- and Y-directions, which will cause the diffraction orders to be distributed along the Y- and X-directions accordingly, the grating may alternatively be ruled only in one direction, giving diffraction orders distributed in the other direction. The grating need not comprise rectilinear structures as shown in FIG. 2, but may rather comprise substantially any suitable type of diffractive structure in order to optimize the grating orders to be of the desired spacing and energy and thus enhance the performance of the measurement system. As yet another alternative, the grating may be formed on another optical surface following micromirror 46 in the outgoing beam path, such as on a cover glass (not shown), with similar effect.

Micromirror 46 and support 72 are mounted on a pair of rotors 76, which comprise permanent magnets. (Only one of the rotors is visible in this figure.) Rotors 76 are suspended in respective air gaps of magnetic cores 78. Cores 78 are wound with respective coils 80 of conductive wire, thus creating an electromagnetic stator assembly. Driving an electrical current through coils 80 generates a magnetic field in the air gaps, which interacts with the magnetization of rotors 76 so as to cause the rotors to rotate or otherwise move within the air gaps.

Specifically, coils 80 may be driven with high-frequency differential currents so as to cause micromirror 46 to rotate resonantly back and forth about spindles 70 at high speed (in the range of 2-10 kHz, for example). This resonant rotation generates the high-speed Y-direction raster scan of the output beam from scanning head 40, which is monitored using the diffraction orders generated by grating 82. At the same time, coils 80 are driven together at lower frequency to drive the X-direction scan by rotation of support 72 about spindles 74 through the desired scan range. Alternatively, other stator configurations and drive schemes may be used for these purposes. The X- and Y-rotations together generate the overall raster scan pattern of micromirror 46.

Assembly of optical head 40 from discrete optical and mechanical components, as shown in FIG. 1, requires precise alignment and can be costly. In alternative embodiments, all parts requiring precise placement and alignment (such as the light transmitter, receiver, and associated optics) may be combined in a single integrated package on a silicon optical bench (SiOB), as described in the above-mentioned U.S. patent application Ser. No. 13/766,801.

FIG. 3 is a schematic plot of signals output by receiver 48 during a scan of micromirror 46, in accordance with an embodiment of the invention. In this embodiment, grating 82 is ruled as shown in FIG. 2 and generates "stray" reflections, in the form of diffraction orders, that are distributed roughly 10° apart. Alternatively, the grating may be designed to give diffraction orders of substantially any desired relative intensity and spacing, as dictated by system requirements. Each horizontal line in FIG. 3 corresponds to the signal output by receiver 48 in response to one light pulse emitted by transmitter 44 as micromirror 46 scans in the Y-direction. For simplicity, the pictured example assumes the pulses to be emitted at scan intervals of 1°, although in practice the angular separation between successive pulses is generally smaller and may vary with time or other system parameters. Each of the light pulses is reflected back from a corresponding point in the scene being scanned by optical head 40, and the returning optical pulse generates an electrical pulse indicated by a corresponding peak 90 at the right side of the figure. The time delay of each peak 90 (in nanoseconds) is indicative of the round-trip time of flight of the light pulse to and from the corresponding point in the scene, and hence of the distance of the point from the optical head.

In addition, at certain angles (0° and 10° in the pictured example), one of the diffraction orders of grating 82 reflects directly back to receiver 48. Corresponding peaks 92 are shown at 0° and 10° at the left side of the figure. The time delay of peaks 92 is very short, since the pulses return to receiver 48 directly from mirror 46, typically less than a nanosecond after being emitted from transmitter 44. The delay of these stray light peaks (which includes electronic delay) may vary with system conditions, such as temperature, but such delay is usually slowly varying, and therefore can be dealt with and does not significantly degrade the quality of the position measurement. Generally, there is some stray light reflected back to receiver 48 from every pulse emitted by transmitter 44, and these stray reflections tend to appear at all angles. The structure imposed by grating 82 creates much stronger stray light peaks at specific angles, which are shown in FIG. 3, and the weaker stray reflections are omitted from the figure for the sake of clarity and simplicity.

Controller 30 distinguishes peaks 92 based on their short delay, and may use them for two purposes:
  To verify that scanner 64 is operating properly.
  To calibrate the angular scale and scanning speed of micromirror 46 in real time.

Detection of peaks 92 at the expected times is a reliable indicator of proper operation of the scanner, and ensures that the scanner is not stuck or has otherwise malfunctioned. When controller 30 fails to detect peaks 92 as expected, the controller determines that a malfunction has occurred, and may issue an alert and/or take other preventive action, such as turning off the beam output by transmitter 44 in order to avoid a possible eye hazard.

For purposes of calibration, it may be desirable to take into account that the spacing of the diffraction lobes is proportional to the wavelength of the light, which may vary with operating conditions, such as temperature. Therefore, as part of the calibration procedure, the emitter temperature in transmitter 44 may be measured, and the wavelength calculated accordingly. Additionally or alternatively, the angular scale may be calibrated by applying a two-dimensional grating to micromirror 46 and monitoring the difference between diffraction lobe spacings in the X- and Y-directions. Although both directions will have the same wavelength behavior, they have different driver characteristics and frequencies, and therefore, differences in the X- and Y-directions can be used to calibrate out any wavelength changes.

Although the example of FIG. 3 relates to monitoring of the Y-direction scan, the same sort of technique may be used in monitoring the X-direction scan.

Thus, the addition of grating 82 to micromirror 46 enhances the safety and accuracy of optical head 40, without requiring any additional hardware beyond what is already used in the scan itself. Even the grating itself may be formed by photolithography as part of the same process or in a similar process to that used to produce the micromirror. In one embodiment, the grating outline is formed by photolithography on the mirror. The photolithographic mask can be used to pattern the grating into the reflective metal layer (for example via a lift-off process) or to etch the shallow grating on the mirror surface. These methods are given only by way of example, and other methods may alternatively be used to create a low-efficiency grating on the surface of the device.

The advantages of this approach are not limited to the specific device architecture that is shown in FIGS. 1 and 2, but may rather be used in other sorts of scanning systems, particularly (although not exclusively) MEMS-based scanning systems. The principles of the present invention are not limited to scanning mirrors, may be applied in monitoring the motion of other types of scanning and periodically moving structures, as well. By detecting diffraction lobes created by a suitable grating that is applied to some surface of the structure, it is possible to measure and track the position of the structure as it moves.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. Scanning apparatus, comprising:
    a transmitter, which is configured to emit a beam comprising pulses of light;
    a scanning mirror, which is configured to scan the beam over a scene;
    a receiver, which is configured to receive the light reflected from the scene and to generate an output indicative of the pulses returned from the scene;
    a grating, which is formed on an optical surface in the apparatus and is configured to diffract a portion of the beam at a predetermined angle, so as to cause the diffracted portion to be returned from the scanning mirror to the receiver; and
    a controller, which is coupled to process the output of the receiver so as to detect the diffracted portion and to monitor a scan of the mirror responsively thereto.

2. The apparatus according to claim 1, wherein the grating is formed on the mirror.

3. The apparatus according to claim 2, wherein the grating is formed on the mirror by photolithography.

4. The apparatus according to claim 3, wherein the scanning mirror is produced by applying a photolithographic process to a substrate and then etching the substrate to define the mirror and spindles connecting the mirror to a support, thereby defining an axis of rotation of the mirror relative to the support.

5. The apparatus according to claim 1, wherein the receiver is positioned to receive the pulses reflected from the scene after reflection of the reflected pulses from the scanning mirror.

6. The apparatus according to claim 1, wherein the controller is configured to calibrate the scan of the mirror responsively to detection of the diffracted portion.

7. The apparatus according to claim 6, wherein the grating generates multiple diffraction lobes at different respective angles, and wherein the controller is configured to calibrate an angular scale and speed of the scan by monitoring a spacing between the lobes, responsively to the detection of the diffracted portion.

8. The apparatus according to claim 1, wherein the controller is configured, upon failing to detect the diffracted portion at an expected time, to determine that the apparatus has malfunctioned.

9. The apparatus according to claim 8, wherein the controller is configured to turn off the beam from the transmitter upon determining that the apparatus has malfunctioned.

10. The apparatus according to claim 1, wherein the controller is configured to process the output of the receiver during the scan so as to generate a three-dimensional map of the scene.

* * * * *